(12) United States Patent
Grosse et al.

(10) Patent No.: US 8,010,919 B2
(45) Date of Patent: Aug. 30, 2011

(54) METHOD FOR EVALUATING THE QUALITY OF A COMPUTER PROGRAM

(75) Inventors: Joerg Grosse, Santa Cruz, CA (US); Mark Hampton, La Cote St. Andre (FR)

(73) Assignee: Springsoft USA, Inc., San Jose, CA (US)

( * ) Notice: Subject to any disclaimer, the term of this patent is extended or adjusted under 35 U.S.C. 154(b) by 574 days.

(21) Appl. No.: 11/658,931

(22) PCT Filed: Jul. 28, 2005

(86) PCT No.: PCT/DE2005/001340
§ 371 (c)(1), (2), (4) Date: Feb. 3, 2009

(87) PCT Pub. No.: WO2006/012867
PCT Pub. Date: Feb. 9, 2006

(65) Prior Publication Data
US 2009/0222774 A1 Sep. 3, 2009

(30) Foreign Application Priority Data

Jul. 30, 2004 (DE) .......................... 10 2004 037 403

(51) Int. Cl.
*G06F 17/50* (2006.01)
(52) U.S. Cl. ...................................... 716/106; 716/110
(58) Field of Classification Search .................. 716/1, 4, 716/106, 110
See application file for complete search history.

(56) References Cited

U.S. PATENT DOCUMENTS

| | | | | | |
|---|---|---|---|---|---|
| 4,228,537 A | * | 10/1980 | Henckels et al. | ................ | 714/33 |
| 5,831,996 A | * | 11/1998 | Abramovici et al. | .......... | 714/738 |
| 6,769,107 B1 | * | 7/2004 | Watkins | .......................... | 716/16 |
| 7,007,250 B1 | * | 2/2006 | Bapat et al. | .................... | 716/117 |
| 7,402,897 B2 | * | 7/2008 | Leedy | ............................ | 257/678 |
| 2004/0216081 A1 | * | 10/2004 | Wells et al. | ..................... | 716/18 |

* cited by examiner

*Primary Examiner* — Jack Chiang
*Assistant Examiner* — Suchin Parihar
(74) *Attorney, Agent, or Firm* — McDermott Will & Emery LLP

(57) ABSTRACT

The invention relates to a method for rating the quality of a computer program whose execution involves an integrated circuit's input data and output data being influenced, comprising
(a) provision of a mutated integrated circuit which is obtained by incorporating one or more functional mutations into the (unmutated) integrated circuit;
(b) influencing of the mutated integrated circuit's input data and output data, with the output data from the mutated integrated circuit being recorded;
(c) comparison of the output data obtained in this manner from the mutated integrated circuit with the output data which the computer program expects when the unmutated integrated circuit is influenced; and
(d) rating of the quality of the computer program on the basis of the comparison results.

8 Claims, 7 Drawing Sheets

Fig. 2

```
library IEEE;
use IEEE.std_logic_1164.all; -- import std_logic types
 use IEEE.std_logic_arith.all; -- import add/sub of std_logic_vector ENTITY counter_updown is
PORT ( -- Counter Control Signals
        clock              : IN   std_logic;   -- counter clock
        reset              : IN   std_logic;   -- counter reset
        updown             : IN   std_logic;   -- count direction up/down
        count              : IN   std_logic;   -- count enable
        -- Counter Output Signals
        c0, c1, c2, c3     : OUT std_logic);   -- counter bit 0..3
END counter_updown;

ARCHITECTURE rtl OF counter_updown IS
  -- internal signal declaration
  SIGNAL counter : std_logic_vector(3 DOWNTO 0);
  BEGIN count_process : PROCESS
  -- This process builds the counter
  BEGIN
    -- wait for rising edge of clock (0->1)
    WAIT UNTIL clock'EVENT AND clock = '1';
    IF reset = '0' THEN
      -- set all counter bits to zero
      counter <= (others => '0');
    ELSE
      IF (count = '1') AND (updown = '1') THEN
         -- count up: n, n+1, n+2, ..., 15, 0, 1, ...
         counter <= CONV_STD_LOGIC_VECTOR(UNSIGNED(counter) + 1, 4);
      ELSIF (count = '1') AND (updown = '0') THEN
         -- count down: n, n-1, n-2, ..., 0, 15, 14, ...
        counter <= CONV_STD_LOGIC_VECTOR(UNSIGNED(counter) - 1, 4);
      ELSE
         -- hold counter in the same value as before
         counter <= counter;
      END IF;
    END IF;
    END PROCESS;

-- Connect internal counter to outputs
    c0 <= counter(0);
    c1 <= counter(1);
     c2 <= counter(2);
    c3 <= counter(3);

END rtl;
```

Fig. 3

```
library std,work;
library IEEE;
use ieee.std_logic_1164.all;
use ieee.std_logic_arith.all;
use std.standard.all;

entity counter_updown is
    port (
        -- em is the control port to enable a mutant
        em    : in std_logic_vector (3 downto 0);
        clock : in std_logic;
        reset : in std_logic;
        updown : in std_logic;
        count : in std_logic;
        c0,c1,c2,c3 : out std_logic) ;
end counter_updown ;

library std,work;
architecture rtl of counter_updown is
    signal counter : std_logic_vector(3 downto 0);
begin
    count_process : process
    begin
        wait  until (clock'event and (clock = '1'));
        -- conditional mutants
        if ((em="0011" and false) or
            (em="0100" and true) or
            (em="0101" and (not(reset = '0')))
            or (em/="0011" and em/="0100" and em/="0101" and (reset =
'0'))) then
            -- dead assign mutant
            if em="0110" then
            else
                counter <= (others => '0');
            end if;
        else
            -- conditional mutants
            if ((em="0111" and false) or
                (em="1000" and true) or
                (em="1001" and (not((count = '1') and (updown = '1'))))
                or(em/="0111" and em/="1000" and em/="1001" and ((count =
'1') and (updown = '1')))) then
                -- dead assign mutant
                if em="1010" then
                else
                    counter <= conv_std_logic_vector((unsigned(counter) +
1),4);
                end if;
            -- conditional mutants
            elsif ((em="1011" and false) or
                   (em="1100" and true) or
                   (em="1101" and (not((count = '1') and (updown = '0'))))
or
                   (em/="1011" and em/="1100" and em/="1101" and ((count =
'1') and (updown = '0')))) then
                -- dead assign mutant
```

Fig. 3 (Continuation)

```
            if em="1110" then
            else
                counter <= conv_std_logic_vector((unsigned(counter) -
1),4);
            end if;
        else
            -- dead assign mutant
            if em="1111" then
            else
                counter <= counter;
            end if;
        end if;
     end if;
   end process ;
   c0 <= counter(0);
   c1 <= counter(1);
   c2 <= counter(2);
   c3 <= counter(3);
end rtl ;
``` ly, integrated circuits are described by means of special computer languages, known as High Level Description Languages (HDLs). Customary HDLs are VHDL and Verilog. The HDL file is used to produce the layout of the circuit arrangement and the required photolithographic masks, which can be used to produce the actual circuit arrangement, automatically using special computer programs.

METHOD FOR EVALUATING THE QUALITY OF A COMPUTER PROGRAM

The invention relates to a method for rating the quality of a computer program and to its use when verifying an integrated circuit or a design of an integrated circuit.

The size and complexity of computer programs is constantly increasing. This also has an associated increase in errors, however.

Normally, integrated circuits are described by means of special computer languages, known as High Level Description Languages (HDLs). Customary HDLs are VHDL and Verilog. The HDL file is used to produce the layout of the circuit arrangement and the required photolithographic masks, which can be used to produce the actual circuit arrangement, automatically using special computer programs.

To avoid errors in the integrated circuits, however, it may be necessary to test the circuit arrangements described by means of the HDL file. This is done using programs which simulate the integrated circuit on the basis of the HDL file. Such programs are called simulators. Such a simulator cooperates with a computer program (i.e. computer code) that is known as a "test bench", which provides the input data ("input") which the integrated circuit is intended to process and compares the results of the processing in the simulated circuit with the expected results. The computer program therefore describes (1) the input data (possibly in the form of signal waveforms), (2) the power and correctness criteria which are obtained after the processing of the input data in the simulated circuit, and (3) the actions which the simulator needs to perform when the results of the simulation meet the power and correctness criteria or when this is not the case.

However, the test result is fundamentally dependent on the quality and completeness of the computer program. In respect of the large number of electronic components which are described in the HDL file, it is very difficult to create computer programs which comply with the complexity of the simulated integrated circuit to be tested. Errors in the simulated circuit can be found only if the computer program actually provides tests which relate to the erroneous region of the simulated integrated circuit. Otherwise, a positive test result can sometimes be attributable merely to inadequate testing (or verification) of the integrated circuit. It is therefore necessary to check the quality and the completeness of the computer program. The already low speed of the software simulation for an integrated circuit is reduced further by tests which are intended to check the quality and completeness of the computer program, however.

DE 199 59 157 A1 describes a system for simulating the functions and checking the correctness of a computer program in which mutated computer programs are produced. The computer program may have source code modules comprising functional models of an integrated circuit.

It is an object of the invention to eliminate the drawbacks based on the prior art. In particular, it is an aim to specify a method which allows the quality of a computer program to be rated at much higher speed.

The invention provides a method for rating the quality of a computer program whose execution involves an integrated circuit's input data and output data being influenced, comprising (a) provision of a mutated integrated circuit which is obtained by incorporating one or more functional mutations into the (unmutated) integrated circuit;

(b) influencing of the mutated integrated circuit's input data and output data, with the output data from the mutated integrated circuit being recorded;

(c) comparison of the output data obtained in this manner from the mutated integrated circuit with the output data which the computer program expects when the unmutated integrated circuit is influenced; and (d) rating of the quality of the computer program on the basis of the comparison results.

Expediently, in step (a) the functional mutations are made in the file which describes the (unmutated) integrated circuit. The mutated file obtained in this manner can then be used to produce the mutated integrated circuit. It is therefore not necessary to produce the (unmutated) integrated circuit itself. To carry out the inventive method, it is instead sufficient if the mutated circuit is actually produced.

The computer program may comprise a test bench for an integrated circuit or for the design of an integrated circuit. In this case the method can be used when verifying an integrated circuit or the design of an integrated circuit.

The method can be carried out at high speed in comparison with the prior art, which requires software simulation of the integrated circuit.

The mutated integrated circuit is preferably implemented on one or more field programmable gate arrays (FPGA).

In this context, functional mutations are understood to mean mutations which are incorporated into the RTL plane (RTL=Registered Transfer Level) or a higher plane (system plane or algorithmic plane) of a design of an integrated circuit or of the integrated circuit itself. A mutation is a deliberate alteration to the integrated circuit over the unmutated integrated circuit. Examples of suitable mutation types are logic negation errors, omission of logic factors, incorrect logic factors, omissions of logic expressions, incorrect logic expressions, incorrect numerical values and case omissions.

The invention is explained in more detail below with reference to drawings, in which FIG. 1 shows a flowchart to illustrate step (a) of the inventive method;

FIG. 2 shows the HDL file for an exemplary unmutated integrated circuit;

FIG. 3 shows the HDL' file for the mutated integrated circuit shown in FIG. 2;

Figure 1:
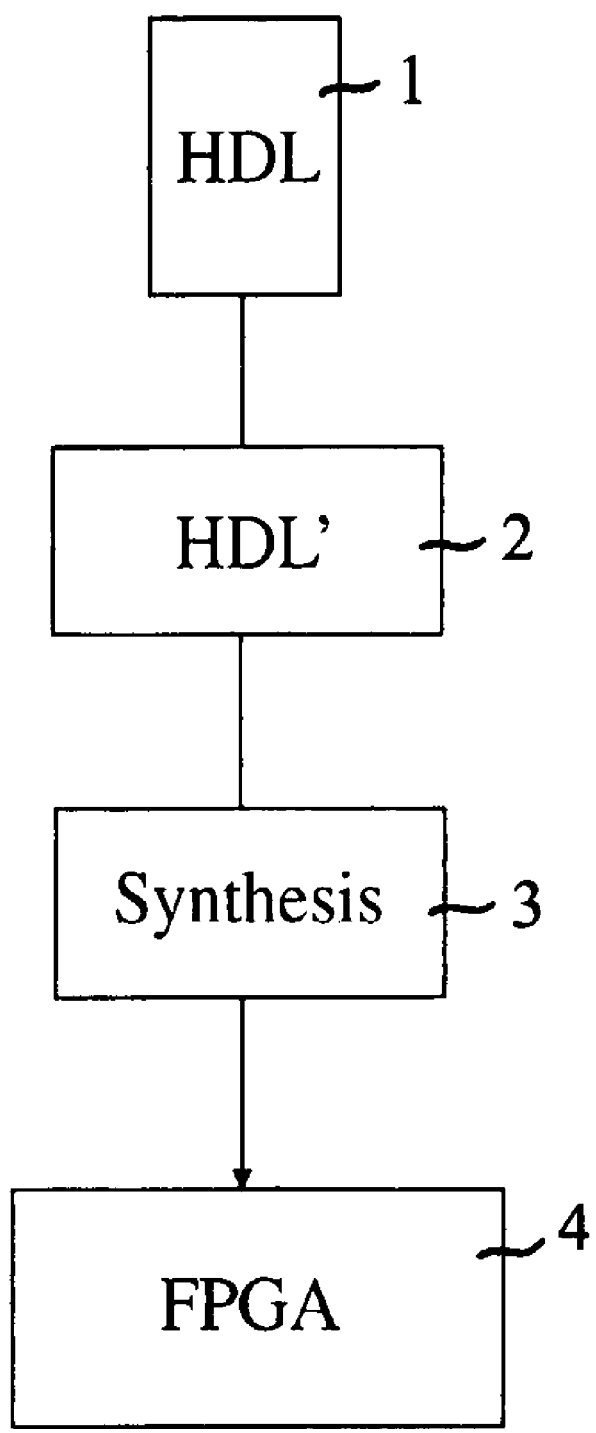

FIG. 1 illustrates step (a) of the inventive method. Step (a) accordingly comprises provision of a file which comprises the code from an integrated circuit, for example from an HDL file 1. In this HDL file 1, one or more functional mutations are incorporated, which gives a mutated HDL file, HDL' file 2. The HDL' file 2 may contain a plurality of functional mutations, with only one of these mutations ever being active following implementation of the mutated circuit on one or more FPGAs.

The functional mutations can be provided by a mutation production device and in so being can be selected from a predefined set of mutation types. The number, type and order of the mutations is dependent on the complexity and the purpose of the specific integrated circuit.

Next, the mutated integrated circuit is synthesized (synthesis 3) on the basis of the mutated HDL' file 2, and the mutated circuit is implemented on an FPGA.

The HDL file shown in FIG. 2 contains the complete HDL code for a 4-bit up/down counter which has the data outputs C0, C1, C2 and C3 and counts from 0 to 15 or in the opposite direction. It comprises the following data inputs:

Reset: when Reset=0, the counter is reset to the value 0 if a rising clock edge is present (i.e. clock changes from 0 to 1);
Clock: Clock input—rising edge (also called "clock edge")
UpDown: the counter adds when UpDown=1; it subtracts when UpDown=0;
Count: the value of the counter is increased by one upon the rising clock edge when Count=1, Reset=1 and UpDown=1; the value of the counter is decreased by one upon the rising clock edge when Count=1, Reset=1 and UpDown=0; the value of the counter is not altered when Count=0 and Reset=1.

The HDL' file shown in FIG. 3 contains mutations which have been inserted into the HDL file shown in FIG. 2. The HDL' code describes a 4-bit up/down counter which has the data outputs C0, C1, C2 and C3 and counts from 0 to 15 or in the opposite direction.

It comprises the following data inputs:
Reset: when Reset=0, the counter is reset to the value 0 if a rising clock edge is present (i.e. clock changes from 0 to 1);
Clock: Clock input—rising edge
UpDown: the counter adds when UpDown=1; it subtracts when UpDown=0;
Count: the value of the counter is increased by one upon the rising clock edge when Count=1, Reset=1 and UpDown=1; the value of the counter is decreased by one upon the rising clock edge when Count=1, Reset=1 and UpDown=0; the value of the counter is not altered when Count=0 and Reset=1.
Em: allows one mutation $em_i$ from the mutations $em_n$ (n 1 to 13) inserted into the HDL' file to be activated while all other mutations are inactive.

The individual functional mutations are encoded in the HDL' file 2 in binary form as em="0011" ($em_1$), em=2"+0100" ($em_2$) ... em="1110" ($em_{13}$).

Figure 4:
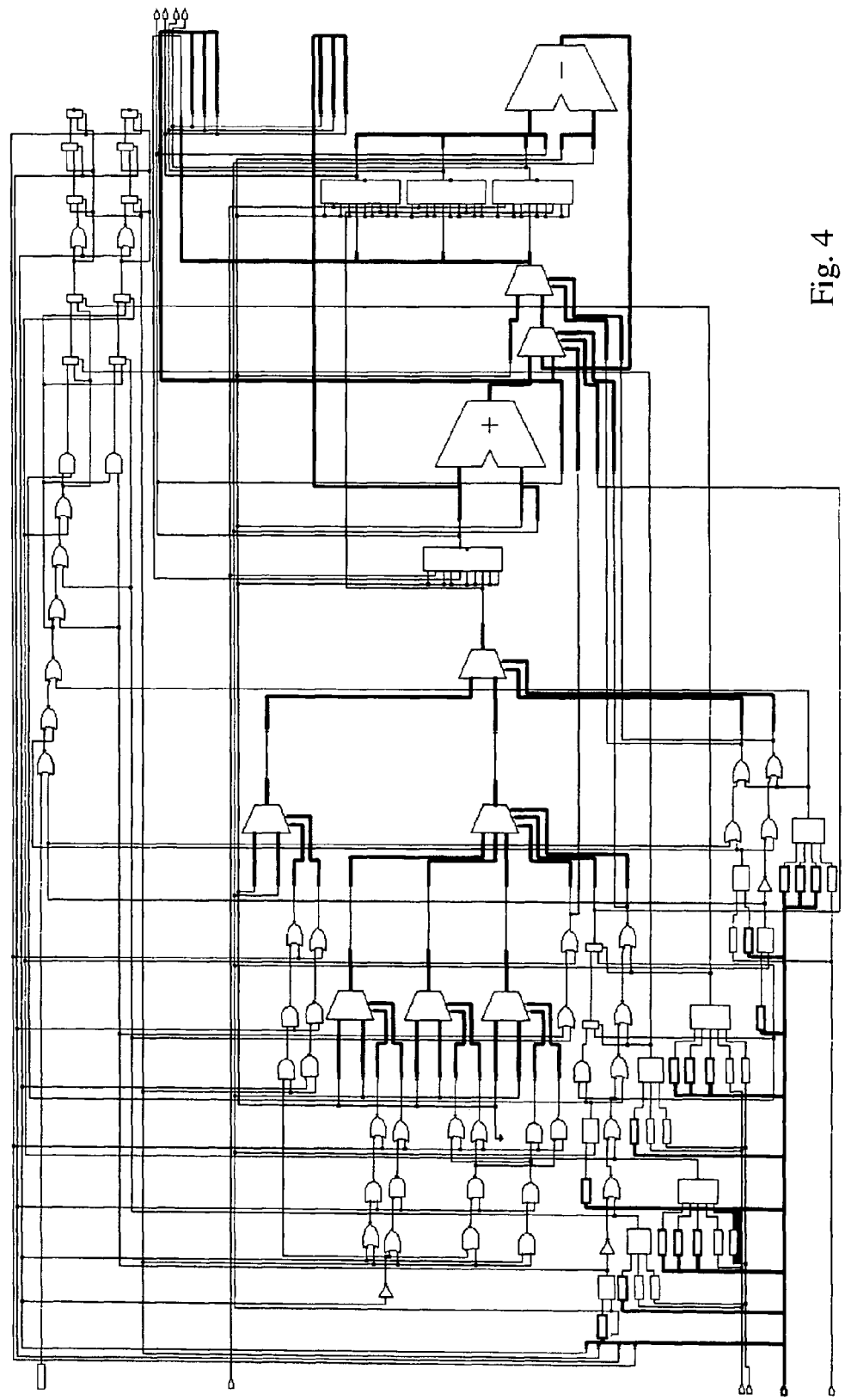
FIG. 4 shows an illustration of the synthesized integrated circuit from FIG. 3.

FIG. 4 shows the circuit diagram for a mutated circuit synthesized on the basis of the HDL' file 2.

When a mutated integrated circuit has been implemented on the FPGA in this manner (step (a) of the inventive method), the data inputs of the mutated circuit have input data applied to them by a test program which is executed on a computer, and the output data obtained at the data outputs of the mutated integrated circuit are recorded (step (b) of the inventive method).

Figure 5:
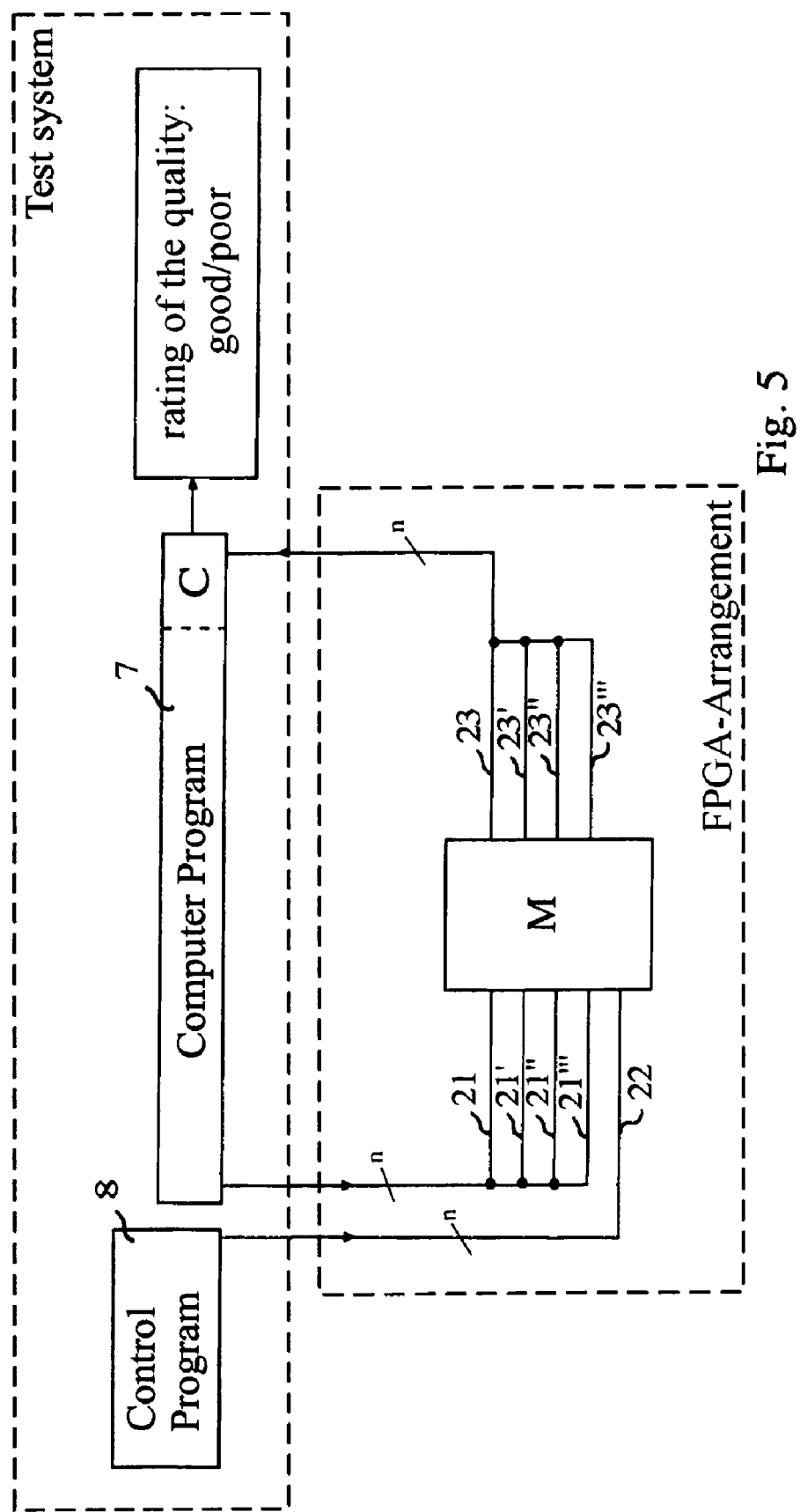
FIG. 5 shows a schematic illustration of a first embodiment of the inventive method.

A first possibility for performing step (c) of the inventive method on the basis of the mutated integrated circuit shown in FIG. 3, which has been implemented on an FPGA, is illustrated in FIG. 5. In FIG. 5, the mutated circuit is identified by "M"; the mutated circuit comprises the data inputs 21 (Reset), 21' (Clock), 21" (UpDown), 21'" (Count) and the additional data input 22, which corresponds to the data input Em (see FIG. 3). SP identifies the control program which activates and deactivates the mutations $em_n$ incorporated into the circuit via the data input Em.

The mutated circuit M has input data applied to it via the input ports, the input data being provided by the computer program 7. The output data 23 from the mutated circuit M are supplied to the computer program 7, where (identified by the letter "C") they are compared with the values (expected values) which the computer program would expect for an unmutated circuit. In this context, the following comparison result is obtained: if the output data 24 correspond to the expected values then the activated mutation has had no influence on the processing of the input data in the mutated circuit. If the output data 24 differ from the expected values then the activated mutation has altered the processing of the input data in the mutated circuit.

If no mutation is active then the mutated integrated circuit behaves like its underlying unmutated circuit.

The mutated integrated circuit M is implemented on one or more FPGAs (FPGA arrangement). This is illustrated in FIG. 5 by the dashed box labeled "FPGA arrangement". The control program 8, the computer program comprising the subunit C and the rating of the quality of the computer program are implemented on a conventional computer. The computer is illustrated by the dashed box labeled "test system".

Figure 6:
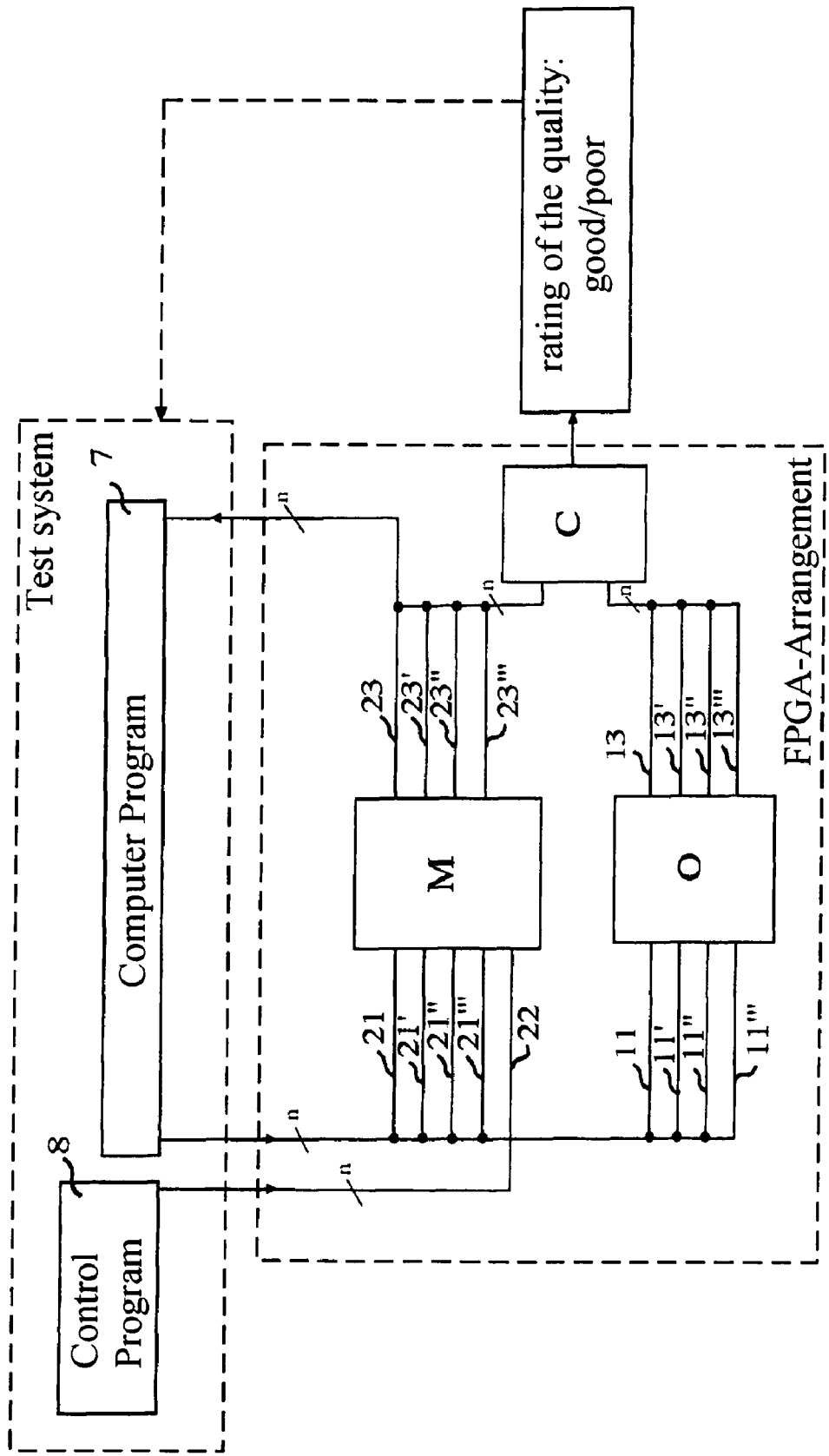
FIG. 6 shows a schematic illustration of a second embodiment of the inventive method.

A second possibility for implementing step (c) of the inventive method on the basis of the mutated HDL' file shown in FIG. 3 is illustrated in FIG. 6. In FIG. 5, the mutated circuit is identified by "M" and the unmutated circuit is identified by "O". Both the mutated circuit M and the unmutated circuit O are produced on a respective FPGA. The unmutated circuit comprises the data inputs 11, 11', 11" and 11'". The mutated circuit comprises the data inputs 21, 21', 21", 21'" and the additional data input 22, which corresponds to the data input em (see FIG. 3). The control program activates and deactivates the mutations incorporated into the mutated integrated circuit via the data input em.

The unmutated circuit O and the mutated circuit M have the same input data applied to them by the input ports, the input data being provided by the computer program 7. The output data 13, 13', 13' and 13'" from the unmutated circuit O and the output data 23, 23', 23", 23'" from the mutated circuit M are supplied to a comparator C and are compared with one another, with the following comparison result being obtained: if the output data 13, 13', 13" and 13'" correspond to the output data 23, 23', 23", 23'" then the activated mutation has had no influence on the processing of the input data in the mutated circuit. If the output data 13, 13', 13" and 13'" differ from the output data 23, 23', 23", 23'" then the activated mutation has altered the processing of the input data in the mutated circuit.

The mutated integrated circuit M, the unmutated circuit O and the comparator C are implemented on one or more FPGAs together or separately. This is illustrated in FIG. 5 by the dashed box labeled FPGA arrangement. The control program 8 and the computer program 7 are implemented on a conventional computer. The computer is illustrated by the dashed box labeled "test system". The evaluation of the results obtained from a comparator C, i.e. rating of the quality, can be performed by a program which is part of the test system, for example, including by the computer program 7 (arrow 9).

The input data are provided by a computer program. If this computer program is a test bench, i.e. a program which is intended to be used to test an integrated circuit for errors, then the comparison result can be used to conclude the following: an activated mutation should alter the output data from an integrated circuit. If the activated mutation does not alter the output data in comparison with the unmutated circuit, however, then it has had no influence on the processing of the input data in the mutated circuit. In this case, this mutation has not been identified during testing of the integrated circuit by the test software, particularly the test bench which means the test software is inadequate. The quality of this computer program is therefore poor.

If the activated mutation has altered the output data in comparison with the unmutated circuit, however, then it has had an influence on the processing of the input data in the mutated circuit. In this case, this mutation has been identified during testing of the integrated circuit by the test software, particularly the test bench, which means that the test software actually tests this region of the circuit. The quality of this computer program is therefore good in relation to this activated mutation.

The mutations which have altered the output data from the mutated integrated circuit M in comparison with unmutated circuits can be referred to as detected mutations. The mutations which have not altered the output data from the mutated integrated circuit M in comparison with unmutated circuits can be referred to as undetected mutations. In that case, the quality G of the computer program can be calculated from the ratio of the number of detected mutations NdM to the total number of mutations NM on the basis of the following equation:

$$G = \frac{N_{dm}}{N_M}$$

The quality of the computer program is therefore higher, the higher the number of detected mutations. If six mutations from the mutations shown in FIG. 3 are detected, for example, because the output data which are obtained with these mutations differ from the expected values then with a total number of 13 mutations a value of 0.46 is obtained for the quality of the computer program. In this case, the quality of the computer program can be referred to as "poor". If, by contrast, 13 of the 13 mutations are detected then a value of 1.00 is obtained for the quality. In this case, the quality of the computer program can be referred to as "good". However, it should be remembered in this context that the precise numerical value beyond which the quality of a computer program can be referred to as "good" is dependent on the demands placed on a specific circuit and on a computer program for this circuit.

If the quality of the computer program can be referred to as "good" then this computer program, assuming it is a test program for an integrated circuit or for a design of an integrated circuit, is suitable for use to verify the unmutated circuit, since it is able to record unintentional mutations there. If the quality of the computer program has to be referred to as "poor", however, then this computer program is not suitable for use to verify the unmutated circuit, since it is not able or only inadequately able to record unintentional mutations there.

In the mutated integrated circuit, a respective mutation is active. The output data from the mutated integrated circuit containing the first activated mutation $M_1$ (labeled $em_1$ in FIG. 3) are recorded. Next, mutation $Mu_1$ is deactivated and the next mutation $Mu_2$ (labeled $Em_2$ in FIG. 3) is activated. The output data from the mutated integrated circuit containing the second activated mutation $Mu_2$ are recorded. This procedure is repeated for each of the mutations which have been incorporated into the mutated integrated circuit. The order of activation of the mutations can be altered on the basis of expediency considerations.

The invention is not limited to rating the quality of a computer program which is used to verify integrated circuits or the designs of integrated circuits.

The invention claimed is:

1. A method for rating the quality of a computer program whose execution involves an integrated circuit's input data and output data being influenced, comprising:
   generating a mutated integrated circuit by incorporating a plurality of functional mutations into an unmutated integrated circuit, wherein the mutated integrated circuit is implemented using one or more field programmable gate arrays (FPGA);
   recording first output data generated from the mutated integrated circuit having received input data;
   comparing, using a computer, the first output data with second output data generated from the unmutated integrated circuit having received the input data; and
   determining a quality of the computer program based on the comparison,
   wherein one of the plurality of incorporated functional mutations is active while the remaining plurality of incorporated functional mutations are inactive,
   wherein the recording, the comparing, and the determining are repeated until each of the plurality of incorporated functional mutations has been active, and
   wherein the quality of the computer program is based on a total number of incorporated functional mutations that are identified from the repeated comparison of the first output data with the second output data in relation to the number of the plurality of incorporated functional mutations.

2. The method as claimed in claim 1, wherein the computer program is a test program for an integrated circuit or the design of an integrated circuit.

3. The method as claimed in claim 1, wherein the first output data is formed in the computer program.

4. The method as claimed in claim 1, wherein the second output data is obtained by the computer program when the unmutated integrated circuit receives the input data.

5. The method as claimed in claim 4, wherein the first output data and the second output are obtained in parallel.

6. The method as claimed in claim 1, wherein the quality of the program is determined as poor if no incorporated functional mutations are identified, or the number of incorporated functional mutations identified is lower than the number of the plurality of incorporated functional mutations.

7. The method as claimed in claim 1, wherein the quality of the program is determined as good if the plurality of incorporated functional mutations are identified.

8. The method as claimed in claim 1, wherein the computer program is a test program for an integrated circuit or a design of an integrated circuit.

* * * * *